US012628668B2

(12) United States Patent
Kang

(10) Patent No.: US 12,628,668 B2
(45) Date of Patent: May 12, 2026

(54) SEMICONDUCTOR PACKAGE

(71) Applicant: SAMSUNG ELECTRONICS CO., LTD., Suwon-si (KR)

(72) Inventor: Myungsam Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 549 days.

(21) Appl. No.: 18/109,392

(22) Filed: Feb. 14, 2023

(65) Prior Publication Data

US 2024/0030145 A1     Jan. 25, 2024

(30) Foreign Application Priority Data

Jul. 20, 2022     (KR) ........................ 10-2022-0089282

(51) Int. Cl.
| | |
|---|---|
| *H01L 23/538* | (2006.01) |
| *H01L 21/48* | (2006.01) |
| *H01L 23/00* | (2006.01) |
| *H10B 80/00* | (2023.01) |

(52) U.S. Cl.
CPC ...... *H01L 23/5385* (2013.01); *H01L 21/4853* (2013.01); *H01L 23/5386* (2013.01); *H01L 24/11* (2013.01); *H01L 24/13* (2013.01); *H01L 24/14* (2013.01); *H01L 24/16* (2013.01); *H10B 80/00* (2023.02); *H01L 2224/11825* (2013.01); *H01L 2224/13007* (2013.01); *H01L 2224/13147* (2013.01); *H01L 2224/13562* (2013.01); *H01L 2224/1357* (2013.01); *H01L 2224/13644* (2013.01); *H01L 2224/13655* (2013.01); *H01L 2224/16227* (2013.01); *H01L*

*2924/14361* (2013.01); *H01L 2924/1437* (2013.01); *H01L 2924/1438* (2013.01);
(Continued)

(58) Field of Classification Search
CPC ..... H01L 23/535–5381; H01L 23/5383; H01L 23/5386
See application file for complete search history.

(56) References Cited

U.S. PATENT DOCUMENTS

| | | | |
|---|---|---|---|
| 8,872,349 | B2 | 10/2014 | Chiu et al. |
| 10,229,892 | B2 | 3/2019 | Appelt |
| 11,075,166 | B2 | 7/2021 | Li et al. |

(Continued)

FOREIGN PATENT DOCUMENTS

| | | |
|---|---|---|
| CN | 111128949 A | 5/2020 |
| JP | 2006279062 A | 10/2006 |

(Continued)

*Primary Examiner* — Evan G Clinton
(74) *Attorney, Agent, or Firm* — Muir Patent Law, PLLC

(57) ABSTRACT

A semiconductor package includes a connection substrate with a cavity, a first semiconductor chip and a second semiconductor chip on the connection substrate, a third semiconductor chip in the cavity of the connection substrate, the first semiconductor chip and the second semiconductor chip being on the third semiconductor chip and being connected to each other through the third semiconductor chip, and a molding layer that covers the first semiconductor chip, the second semiconductor chip, and the third semiconductor chip, wherein the third semiconductor chip includes first bumps that are exposed through the molding layer and are connected to the first semiconductor chip and the second semiconductor chip.

20 Claims, 11 Drawing Sheets

(52) U.S. Cl.
CPC ................. *H01L 2924/1443* (2013.01); *H01L 2924/14511* (2013.01); *H01L 2924/1461* (2013.01)

(56)     References Cited

U.S. PATENT DOCUMENTS

| | | | |
|---|---|---|---|
| 11,094,637 B2 | 8/2021 | Rubin et al. | |
| 11,222,838 B2 | 1/2022 | Lin | |
| 11,270,941 B2 | 3/2022 | Seidemann et al. | |
| 2019/0304912 A1 | 10/2019 | Ecton et al. | |
| 2021/0183773 A1* | 6/2021 | Rubin ..................... | H01L 24/17 |
| 2021/0202440 A1* | 7/2021 | Chang Chien ........ | H01L 23/481 |
| 2021/0225771 A1 | 7/2021 | Fay et al. | |
| 2021/0391263 A1 | 12/2021 | Nie et al. | |
| 2022/0270976 A1* | 8/2022 | Sun ......................... | H01L 24/14 |

FOREIGN PATENT DOCUMENTS

| | | |
|---|---|---|
| KR | 1020210069859 A | 6/2021 |
| KR | 1020210110008 A | 9/2021 |
| KR | 1020220019186 A | 2/2022 |

* cited by examiner

1

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0089282, filed on Jul. 20, 2022, in the Korean Intellectual Property Office, the disclosure of which is hereby incorporated by reference in its entirety.

BACKGROUND

1. Field

The present disclosure relates to a semiconductor package.

2. Description of the Related Art

A semiconductor package may be provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the PCB. With the recent development of electronic industry, the semiconductor package is variously developed to have a compact size, small weight, and/or low manufacturing cost. In addition, semiconductor packages may be implemented as high-capacity mass storage devices.

SUMMARY

According to some embodiments, a semiconductor package may include a connection substrate that has a cavity in the connection substrate; a third semiconductor chip in the connection substrate; a first semiconductor chip and a second semiconductor chip that are on the third semiconductor chip and are connected to each other through the third semiconductor chip; and a molding layer that covers the first, second, and third semiconductor chips. The third semiconductor chip may include a plurality of first bumps that are exposed from the molding layer and are connected to the first and second semiconductor chips.

According to some embodiments, a semiconductor package may include a connection substrate that has a cavity in the connection substrate; a third semiconductor chip in the cavity; a first semiconductor chip and a second semiconductor chip that are on the third semiconductor chip and are connected to each other through the third semiconductor chip; and a molding layer that covers the first, second, and third semiconductor chips. The third semiconductor chip may include a plurality of first bumps exposed from the molding layer and connected to the first and second semiconductor chips. The connection substrate may include a plurality of second bumps exposed from the molding layer and connected to the first and second semiconductor chips.

According to some embodiments, a semiconductor package may include a connection substrate that has a cavity in the connection substrate; a third semiconductor chip in the cavity; a molding layer between the third semiconductor chip and the connection substrate, the molding layer surrounding the third semiconductor chip and a top surface of the connection substrate; a first semiconductor chip on the molding layer and adjacent to one side of the connection substrate, the first semiconductor chip being connected to the connection substrate and the third semiconductor chip; and a second semiconductor chip on the molding layer and adjacent to another side of the connection substrate, the second semiconductor chip being connected to the connection substrate and the third semiconductor chip. The third semiconductor chip may include a plurality of first bumps that protrude from a top surface of the third semiconductor chip and are connected to bottom surfaces of the first and second semiconductor chips; and a first oxidation barrier layer that covers a surface of the first bump. The connection substrate may include a plurality of second bumps that protrude from the top surface of the connection substrate and are connected to the bottom surface of one of the first and second semiconductor chips; and a second oxidation barrier layer that covers a surface of the second bump. The third semiconductor chip may have a thickness the same as a thickness of the connection substrate. The first bump and the second bump may have the same vertical length. A diameter of the first bump may be in a range of about 10 μm to about 40 μm. A diameter of the second bump may be in a range of about 50 μm to about 100 μm.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
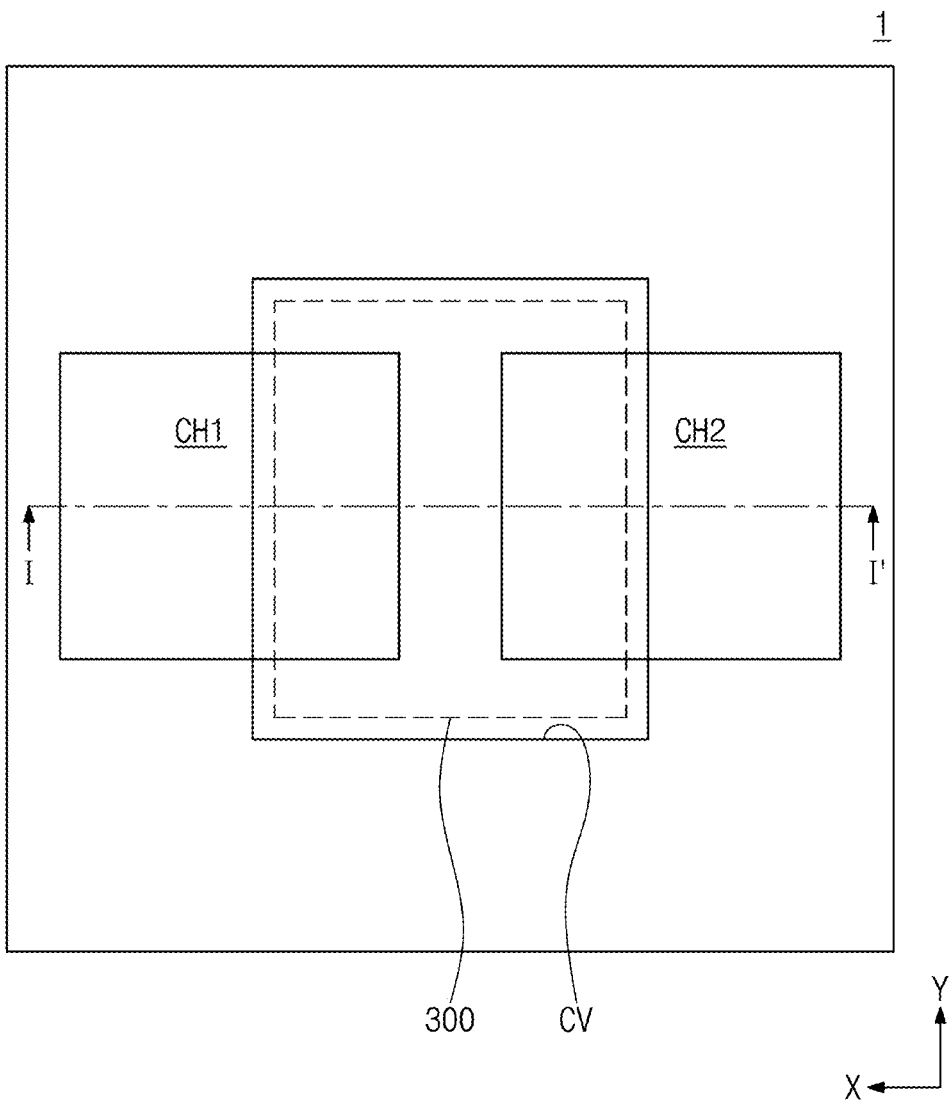
FIG. 1 illustrates a plan view of a semiconductor package according to some embodiments.
Figure 2:
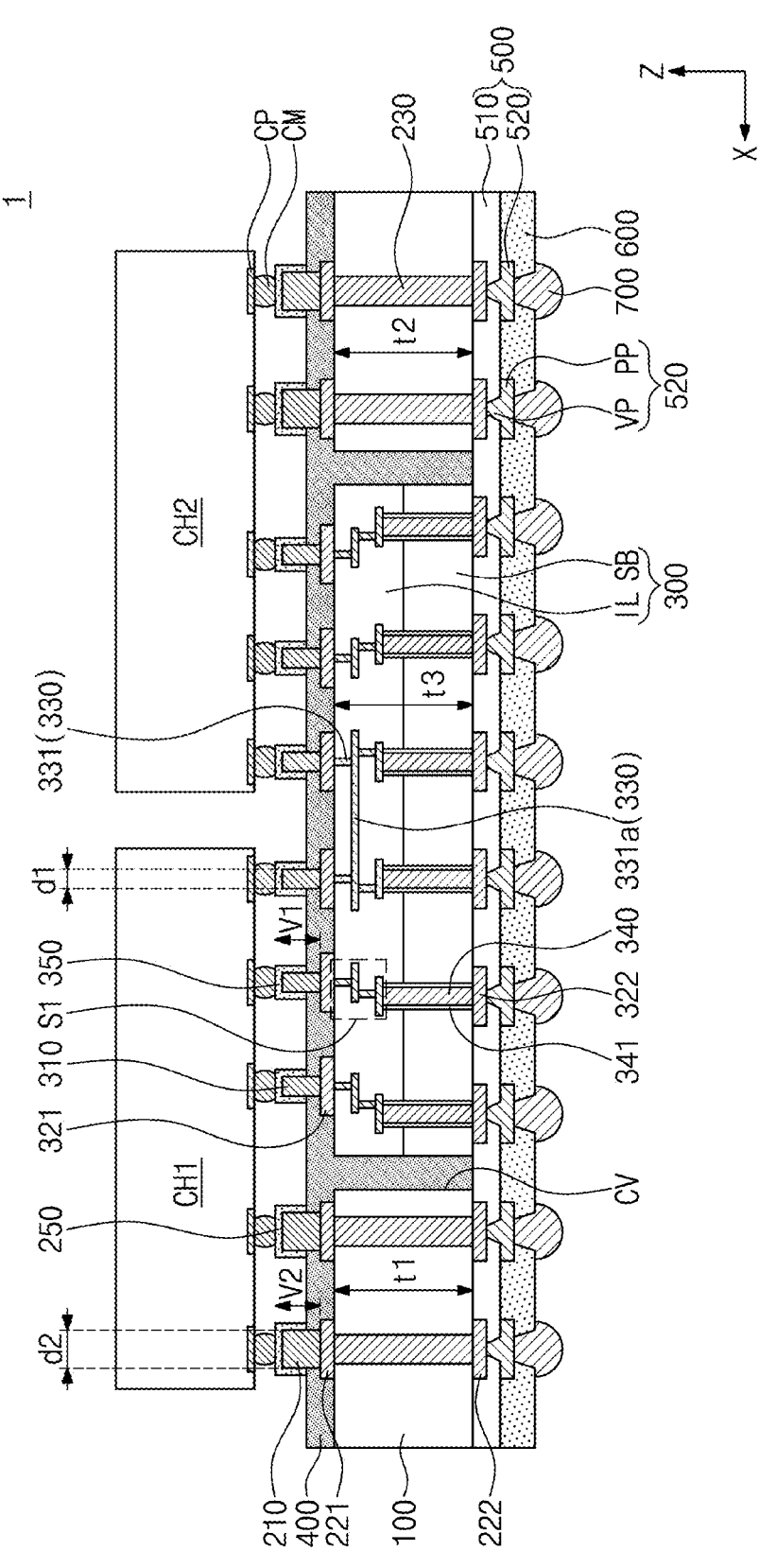
FIG. 2 illustrates a cross-sectional view along line I-I' of FIG. 1.

FIG. 1 illustrates a plan view showing a semiconductor package according to some embodiments. FIG. 2 illustrates a cross-sectional view taken along line I-I' of FIG. 1, showing a semiconductor package according to some embodiments.

Referring to FIGS. 1 and 2, a semiconductor package 1 may include a connection substrate 100, a first semiconductor chip CH1, a second semiconductor chip CH2, a third semiconductor chip 300, a molding layer 400, a redistribution substrate 500, a solder resist layer 600, and a plurality of external connection terminals 700.

The connection substrate 100 may be a printed circuit board (PCB). The connection substrate 100 may have a cavity CV formed therein.

The third semiconductor chip 300 may be disposed in the cavity CV of the connection substrate 100. In this description, the third semiconductor chip 300 may be called a bridge interposer. The connection substrate 100 may have a first thickness t1, e.g., in a vertical direction Z, at one side of the third semiconductor chip 300 and a second thickness t2, e.g., in the vertical direction Z, at another side of the third semiconductor chip 300. The first thickness t1 and the second thickness t2 may be the same as each other. The third semiconductor chip 300 may have a thickness the same as or similar to that of the connection substrate 100. The third semiconductor chip 300 may be formed to have a third thickness t3, e.g., in the vertical direction Z, the same as the first thickness t1 and the second thickness t2, e.g., the first through the third thickness t1 to t3 may be equal to each other. The third thickness t3 of the third semiconductor chip 300 may range from about 100 μm to about 300 μm, e.g., about 200 μm.

The third semiconductor chip 300 may be a chip or interposer substrate including a certain circuit pattern for electrical connection with the first semiconductor chip CH1 and the second semiconductor chip CH2 that are mounted on the third semiconductor chip 300. In addition, the third semiconductor chip 300 may serve to connect the first semiconductor chip CH1 and the second semiconductor chip CH2 to the redistribution substrate 500. The third semiconductor chip 300 may include a third semiconductor substrate SB and a third interlayer dielectric layer IL disposed on the third semiconductor substrate SB. A wiring layer 330 may be disposed in the third interlayer dielectric layer IL. The third semiconductor chip 300 may include a plurality of through vias 340 that penetrate the third semiconductor substrate SB and a portion of the third interlayer dielectric layer IL to connect with the wiring layer 330.

Each of the first semiconductor chip CH1 and the second semiconductor chip CH2 may be one selected from a microelectromechanical system (MEMS) device chip and a memory device chip, e.g., a flash memory chip, a dynamic random access memory (DRAM) chip, a static random access memory (SRAM) chip, an electrically erasable programmable read-only memory (EEPROM) chip, a phase change random access memory (PRAM) chip, a magnetic random access memory (MRAM) chip, a resistive random access memory (ReRAM) chip, a high bandwidth memory (HBM) chip, and a hybrid memory cubic (HMC) chip. Each of the first and second semiconductor chips CH1 and CH2 may include chip pads CP disposed on a bottom end thereof. Inner connection members CM may be correspondingly bonded to the chip pads CP. The inner connection members CM may be, e.g., conductive bumps, conductive pillars, and/or solder balls. For example, the first and second semiconductor chips CH1 and CH2 may be adjacent to each other along a direction parallel to the upper surface of the third semiconductor chip 300, e.g., along the X direction, and may be spaced apart from each other along the X direction.

The third semiconductor chip 300 may be directly connected to the first semiconductor chip CH1 and the second semiconductor chip CH2, e.g., the third semiconductor chip 300 may be between the connection substrate 100 and the first and second semiconductor chips CH1 and CH2. The third semiconductor chip 300 may include a plurality of first bumps 310 that protrude from a top surface thereof, and may be connected through the first bumps 310 to the first and second semiconductor chips CH1 and CH2. The first bumps 310 may be connected to the inner connection members CM.

Each of the plurality of first bumps 310 may have a pillar shape. The first bump 310 may include copper (Cu). The first bump 310 may have a diameter d1 ranging from about 10 μm to about 40 μm.

A first oxidation barrier layer 350 may be formed on a surface of the first bump 310, e.g., the first oxidation barrier layer 350 may be between the first bump 310 and a corresponding inner connection member CM. The first oxidation barrier layer 350 may include nickel and gold. The first oxidation barrier layer 350 may be an electroless nickel-gold plating layer. The first oxidation barrier layer 350 may prevent oxidation of the first bump 310. The first oxidation barrier layer 350 may be in, e.g., direct, contact with the inner connection members CM.

The first oxidation barrier layer 350 may include a nickel plating layer and a gold plating layer. The first oxidation barrier layer 350 may have a multi-layered structure. The first oxidation barrier layer 350 may have a shape in which the nickel plating layer surrounds the gold plating layer. The first oxidation barrier layer 350 may have excellent adhesion by which the plurality of first bumps 310 have a stable connection with the first and second semiconductor chips CH1 and CH2, and may also have superior conductivity by which the plurality of first bumps 310 achieve an effective electrical connection of the first and second semiconductor chips CH1 and CH2.

The third semiconductor chip 300 may further include a plurality of upper chip pads 321 and a plurality of lower chip pads 322. The plurality of upper chip pads 321 may be formed on a top surface of the third semiconductor chip 300, and the plurality of lower chip pads 322 may be formed on a bottom surface of the third semiconductor chip 300, e.g., the plurality of upper chip pads 321 and the plurality of lower chip pads 322 may be on opposite surfaces of the third semiconductor chip 300. The plurality of upper and lower chip pads 321 and 322 may have flat shapes. The plurality of first bumps 310 may be positioned on top surfaces of the plurality of upper chip pads 321. The plurality of upper chip pads 321 may correspond to the plurality of first bumps 310, e.g., in a one-to-one correspondence. The plurality of lower chip pads 322 may be connected to the redistribution substrate 500 which will be discussed below.

The molding layer 400 may cover the third semiconductor chip 300 and the first and second semiconductor chips CH1 and CH2. The molding layer 400 may cover a space between the third semiconductor chip 300 and the first semiconductor chip CH1 and space between the third semiconductor chip 300 and the second semiconductor chip CH2.

In addition, the molding layer 400 may cover top surfaces of the third semiconductor chip 300 and the connection substrate 100. The molding layer 400 may cover the top surface of the third semiconductor chip 300 to allow portions of the plurality of first bumps 310 to be exposed from, e.g., through, the molding layer 400, e.g., the plurality of first bumps 310 may extend through and above the molding layer 400 toward the first and second semiconductor chips CH1 and CH2. The first oxidation barrier layer 350 may have a bottom end in contact with a top surface of the molding layer 400, e.g., a lowermost surface of the first oxidation barrier layer 350 may directly contact the top surface of the molding layer 400. For example, the molding layer 400 may include a dielectric polymer, e.g., an epoxy molding compound (EMC).

The first semiconductor chip CH1 and the second semiconductor chip CH2 may be mounted on the molding layer 400. On the molding layer 400, the first semiconductor chip CH1 may be mounted to overlap one side of the third semiconductor chip 300, and the second semiconductor chip CH2 may be mounted to overlap another side of the third semiconductor chip 300.

The connection substrate 100 may include a plurality of second bumps 210 that protrude from the top surface thereof. The plurality of second bumps 210 may be exposed from, e.g., through, the molding layer 400 to contact the first and second semiconductor chips CH1 and CH2, e.g., the plurality of second bumps 210 may extend through and above the molding layer 400 to directly contact the first and second semiconductor chips CH1 and CH2. Some of the second bumps 210 that protrude from the top surface of the connection substrate 100 may be connected to the first semiconductor chip CH1, and others of the second bumps 210 that protrude from the top surface of the connection substrate 100 may be connected to the second semiconductor chip CH2.

Each of the plurality of second bumps 210 may have a pillar shape. The second bump 210 may include copper (Cu). The second bump 210 may have a diameter d2 greater than the diameter d1 of the first bump 310. For example, the diameter d2 of the second bump 210 may range from about 50 μm to about 100 μm.

A second oxidation barrier layer 250 may be formed on a surface of the second bump 210, e.g., the second oxidation barrier layer 250 may be between each of the second bumps 210 and a corresponding inner connection member CM. The second oxidation barrier layer 250 may include nickel and gold. The second oxidation barrier layer 250 may be an electroless nickel-gold plating layer. The second oxidation barrier layer 250 may prevent oxidation of the second bump 210. The second oxidation barrier layer 250 may be in contact with the inner connection members CM. The second oxidation barrier layer 250 may have a bottom end in contact with the top surface of the molding layer 400, e.g., a lowermost surface of the second oxidation barrier layer 250 may directly contact the top surface of the molding layer 400.

As the third semiconductor chip 300 and the connection substrate 100 have the same thickness, as discussed above, the plurality of first bumps 310 of the third semiconductor chip 300 and the plurality of second bumps 210 of the connection substrate 100 may be formed to respectively have vertical lengths V1 and V2 that are the same as each other so as to mount subsequently described semiconductor chips on the third semiconductor chip 300 and the connection substrate 100. The vertical length V1 of the first bump 310 and the vertical length V2 of the second bump 210 may range from about 10 μm to about 20 μm.

The second oxidation barrier layer 250 may have excellent adhesion by which the plurality of second bumps 210 have a stable connection with the first and second semiconductor chips CH1 and CH2, and may also have superior conductivity by which the plurality of second bumps 210 achieve an effective electrical connection of the first and second semiconductor chips CH1 and CH2.

The connection substrate 100 may further include a conductive pillar 230 that penetrates therethrough. The conductive pillar 230 that penetrates the connection substrate 100 may be formed to have a length the same as a thickness of the connection substrate 100. For example, the conductive pillar 230 may have a shape that extends from the bottom surface to the top surface of the connection substrate 100. The conductive pillars 230 may be correspondingly connected to the second bumps 210 formed thereon. The conductive pillars 230 may each include metal, e.g., copper, tin, lead, silver, aluminum, gold, or nickel.

The connection substrate 100 may further include an upper substrate pad 221 and a lower substrate pad 222. The upper substrate pad 221 may be positioned on the conductive pillar 230, and the lower substrate pad 222 may be positioned below the conductive pillar 230. The upper and lower substrate pads 221 and 222 may have a flat shape. The upper substrate pad 221 of the connection substrate 100 may be provided to have the same thickness as that of the upper chip pad 321 of the third semiconductor chip 300, and the lower substrate pad 222 of the connection substrate 100 may be provided to have the same thickness as that of the lower chip pad 322 of the third semiconductor chip 300.

The upper substrate pad 221 may be connected to the second bump 210 positioned thereon. In this case, a portion of the second bump 210 may be exposed from, e.g., through, the molding layer 400 as discussed above, and thus the second bump 210 may be connected to the first semiconductor chip CH1 or the second semiconductor chip CH2 provided thereon. The lower substrate pad 222 may be connected to the redistribution substrate 500 positioned thereunder.

Among the plurality of first bumps 310 of the third semiconductor chip 300, some may be connected to the first semiconductor chip CH1 and others may be connected to the second semiconductor chip CH2. The plurality of first bumps 310 and the plurality of second bumps 210 may be connected to the first semiconductor chip CH1 and the second semiconductor chip CH2 mounted on the mold layer 400 to connect the first and second semiconductor chips CH1 and CH2 to the third semiconductor chip 300 and the connection substrate 100, and at the same time to support the first and second semiconductor chips CH1 and CH2.

In this case, the plurality of first bumps 310 may have their top surfaces at the same level as that of top surfaces of the plurality of second bumps 210. When the third semiconductor chip 300 and the connection substrate 100 are formed to have their thicknesses that are identical or similar to each other, it may not be required that the plurality of first bumps 310 be formed to have their lengths greater than those of the plurality of second bumps 210. The third semiconductor chip 300 may have a thickness of about 100 μm to about 300 μm, e.g., about 200 μm.

The third semiconductor chip 300 may have therein the wiring layer 330 connected to the plurality of first bumps 310, and the wiring layer 330 may connect the first and second semiconductor chips CH1 and CH2 to each other. The wiring layer 330 may include a plurality of line patterns 331a and a plurality of via patterns 331. On the top surface of the third semiconductor chip 300, the line pattern 331a may be connected to the upper chip pad 321 that is coupled to the first bump 310. For example, when the line pattern 331a is connected to two upper chip pads 321, as shown in FIG. 2, the wiring layer 330 may connect to each other the first bumps 310 provided on the two upper chip pads 321. In this configuration, the wiring layer 330 may be simultaneously connected to the first bump 310 of the plurality of first bumps 310 that is connected to the first semiconductor chip CH1 and to the first bump 310 of the plurality of first bumps 310 that is connected to the second semiconductor chip CH2, and thus may connect the first semiconductor chip CH1 and the second semiconductor chip CH2 to each other.

In addition, the third semiconductor chip 300 may include therein a plurality of through vias 340 provided below and connected to the wiring layer 330. The plurality of through vias 340 may be disposed spaced apart from each other. The plurality of through vias 340 may extend in a direction perpendicular to a lengthwise direction of the third semiconductor chip 300.

A dielectric layer 341 may surround a lateral surface of each of the plurality of through vias 340. The dielectric layer 341 may be formed of an oxide layer or a nitride layer. For example, the dielectric layer 341 may be formed of a silicon oxide ($SiO_2$) layer or a silicon nitride ($SiN_x$) layer. As the dielectric layer 341 surrounds the lateral surface of the through via 340, the dielectric layer 341 may electrically insulate the through via 340 from the third semiconductor substrate SB.

As shown in FIG. 2, the wiring layer 330 may include a wiring structure S1 that connects one of the plurality of first bumps 310 to one of the plurality of through vias 340 (dashed frame in FIG. 2). The through via 340 may be connected through the wiring structure S1 to the first bump 310, and thus may outwardly transmit signals generated from one of the first and second semiconductor chips CH1 and CH2 connected to the first bump 310 or may provide signals to one of the first and second semiconductor chips CH1 and CH2 connected to the first bump 310. In this case, signals may be transmitted through the through via 340 within the third semiconductor chip 300, and the signal may thus be delivered more stably and promptly.

The redistribution substrate 500 may be provided below the connection substrate 100 and the third semiconductor chip 300. The redistribution substrate 500 may be connected to the plurality of conductive pillars 230 and the plurality of through vias 340. The redistribution substrate 500 may include a redistribution dielectric layer 510 and a plurality of redistribution patterns 520 formed in the redistribution dielectric layer 510.

In the present embodiment, the redistribution dielectric layer 510 may be a single layer or a multi-stacked layer. The number of the redistribution dielectric layers 510 may be variously changed without being limited to that shown. The redistribution dielectric layer 510 may include a dielectric polymer or a photo-imageable dielectric (PID). For example, the photo-imageable dielectric may include at least one of photosensitive polyimide, polybenzoxazole (PBO), phenolic polymers, and benzocyclobutene polymers.

The redistribution pattern 520 may be disposed in the redistribution dielectric layer 510. The redistribution pattern 520 may be provided in plural. The redistribution pattern 520 may include a via part VP and a pad part PP. The via part VP may have an inclined sidewall. The via part VP may have a width that decreases in an upward direction. The redistribution patterns 520 may include metal, e.g., copper (Cu), aluminum (Al), gold (Au), nickel (Ni), or titanium (Ti).

A solder resist layer 600 may be provided below the redistribution substrate 500. The solder resist layer 600 may cover a bottom surface of the redistribution substrate 500 while exposing a portion of the bottom surface of the redistribution substrate 500. A plurality of external connection terminals 700 may be provided on the bottom surface of the redistribution substrate 500 exposed by the solder resist layer 600.

The external connection terminals 700 may include at least one of solder balls, conductive bumps, and conductive pillars. The solder balls may include, e.g., Sn or SnAg.

In the present embodiment, the first and second semiconductor chips CH1 and CH2 may be electrically connected to the external connection terminals 700 through the connection substrate 100 and the third semiconductor chip 300. Thus, signals may be received from outside or sent outside through the external connection terminals 700.

FIGS. 3 to 11 illustrate cross-sectional views showing stages in a method of fabricating a semiconductor package according to some embodiments. A duplicate description will be omitted below.

Figure 3:
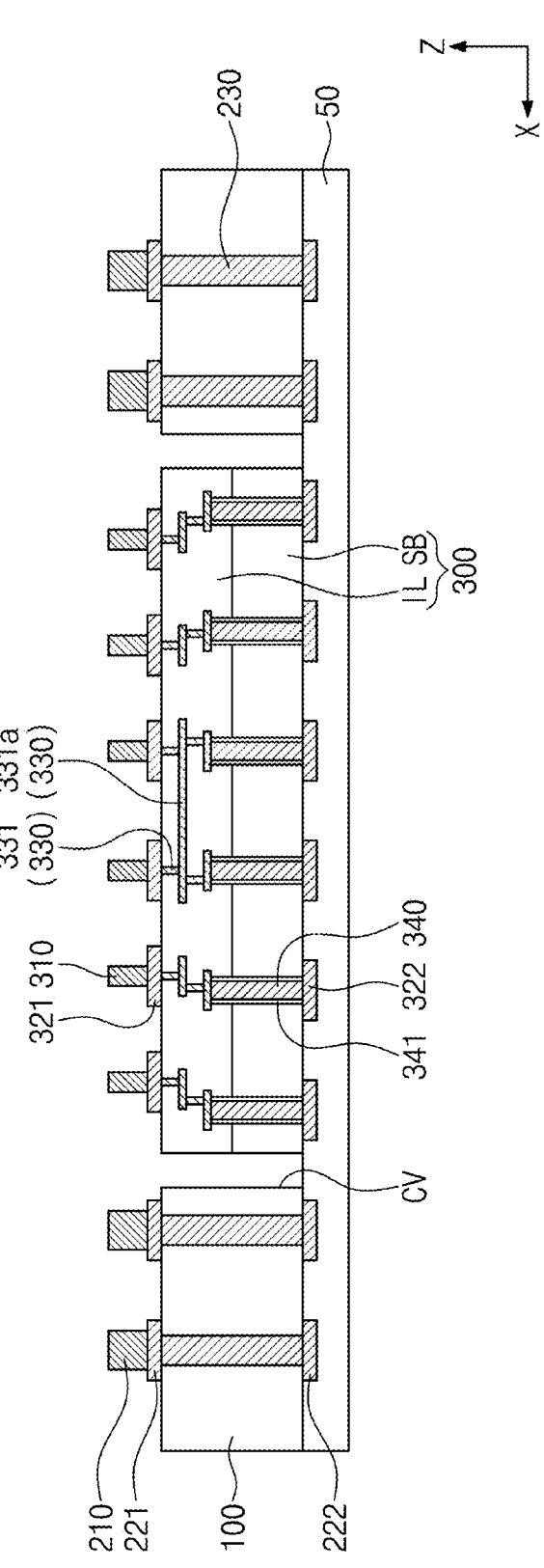
FIGS. 3 to 11 illustrate cross-sectional views of stages in a method of fabricating a semiconductor package according to some embodiments.
Figure 4:
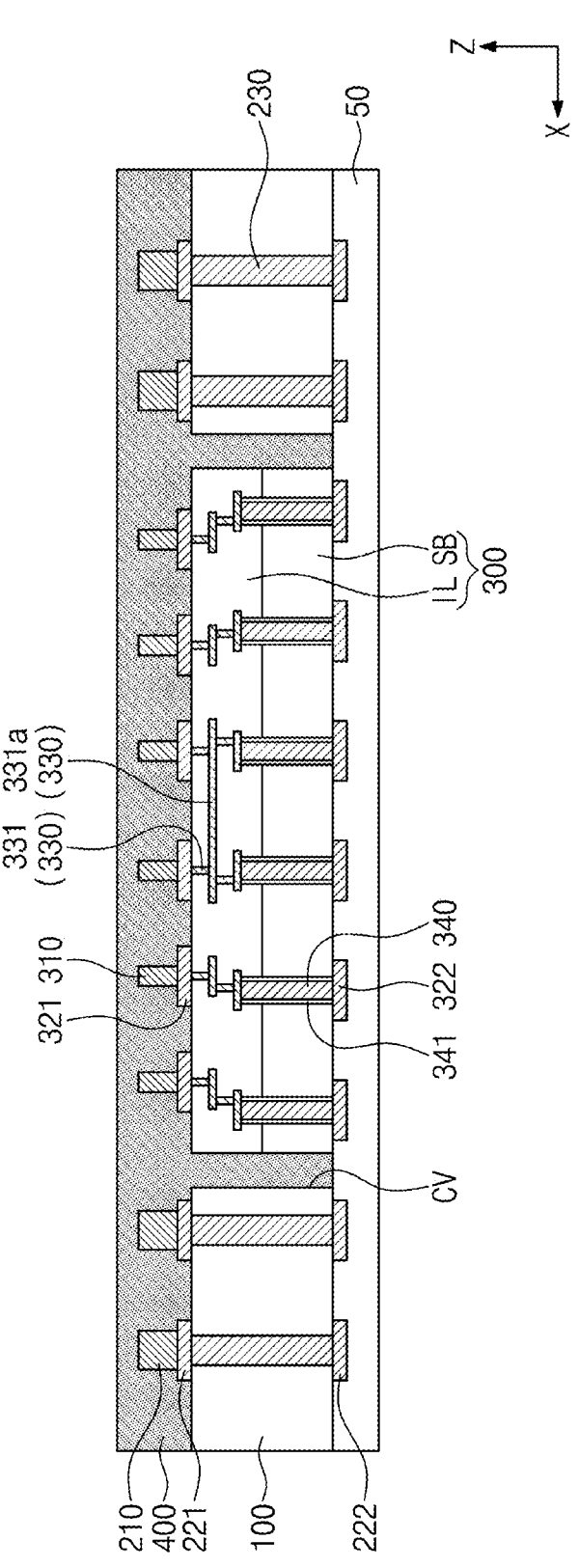

Referring to FIG. 3, the connection substrate 100 and the third semiconductor chip 300 may be provided on a carrier substrate 50. The connection substrate 100 may include a cavity CV. The third semiconductor chip 300 may be disposed in the cavity CV in the connection substrate 100.

The carrier substrate 50 may include, e.g., a polymer. For example, the carrier substrate 50 may include a glue tape, and thus, the connection substrate 100 and the third semiconductor chip 300 may be attached to the carrier substrate 50.

The third semiconductor chip 300 may include the plurality of first bumps 310 that protrude from a top surface thereof. The plurality of upper chip pads 321 may be formed on the top surface of the third semiconductor chip 300, and the plurality of first bumps 310 may be correspondingly formed on top surfaces of the plurality of upper chip pads 321.

The third semiconductor chip 300 may include therein the wiring layer 330 connected to the plurality of first bumps 310. The wiring layer 330 may include the plurality of line patterns 331a and the plurality of via patterns 331. In addition, the third semiconductor chip 300 may include therein the plurality of through vias 340 connected to the wiring layer 330. The third semiconductor chip 300 may include on its bottom surface the plurality of lower chip pads 322 that are formed to correspondingly connect to the plurality of through vias 340. Each of the plurality of through vias 340 may have a top side connected to the line pattern 331a of the wiring layer 330 and a bottom side connected to the lower chip pads 322.

The connection substrate 100 may include the plurality of second bumps 210 that protrude from a top surface thereof. The plurality of upper substrate pads 221 may be formed on the top surface of the connection substrate 100, and the plurality of second bumps 210 may be correspondingly formed on top surfaces of the plurality of upper substrate pads 221. The plurality of lower substrate pads 222 may be formed on a bottom surface of the connection substrate 100.

The connection substrate 100 may include the plurality of conductive pillars 230 that penetrate therethrough. The plurality of conductive pillars 230 may extend from the bottom to top surfaces of the connection substrate 100. The upper substrate pad 221 may be positioned on a top surface of the conductive pillar 230, and the lower substrate pad 222 may be positioned on a bottom surface of the conductive pillar 230.

Referring back to FIG. 4, the molding layer 400 may be formed on the carrier substrate 50. The molding layer 400 may cover the connection substrate 100, the third semiconductor chip 300, and a top surface of the carrier substrate 50. The molding layer 400 may cover a space between the third semiconductor chip 300 and the connection substrate 100, the top surface of the third semiconductor chip 300, and the top surface of the connection substrate 100. The molding layer 400 may cover the plurality of first bumps 310 and the plurality of second bumps 210.

Figure 5:
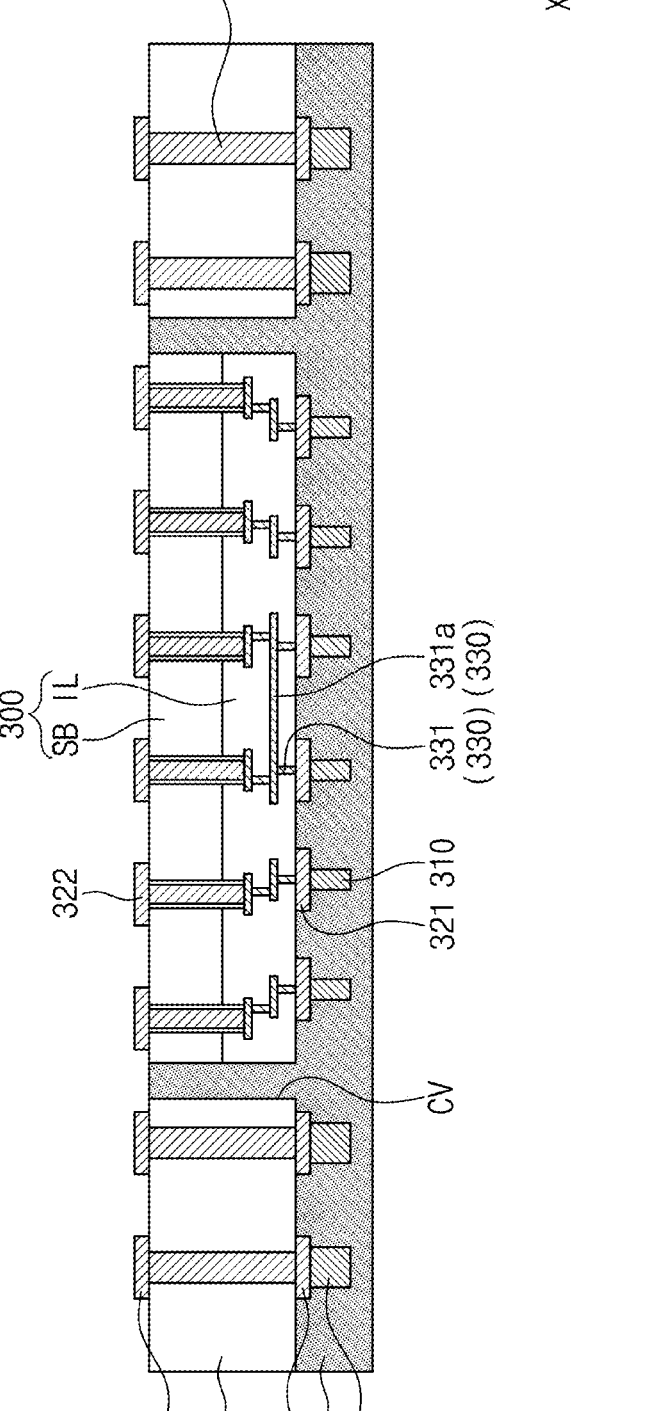

Referring to FIG. 5, the carrier substrate 50 may be turned upside down to allow the bottom surfaces of the third semiconductor chip 300 and the connection substrate 100 to face upwardly. Afterward, the carrier substrate 50 may be removed. The removal of the carrier substrate 50 may expose the lower substrate pads 222 adjacent to the bottom surface of the connection substrate 100 and the lower chip pads 322 adjacent to the bottom surface of the third semiconductor chip 300.

Figure 6:
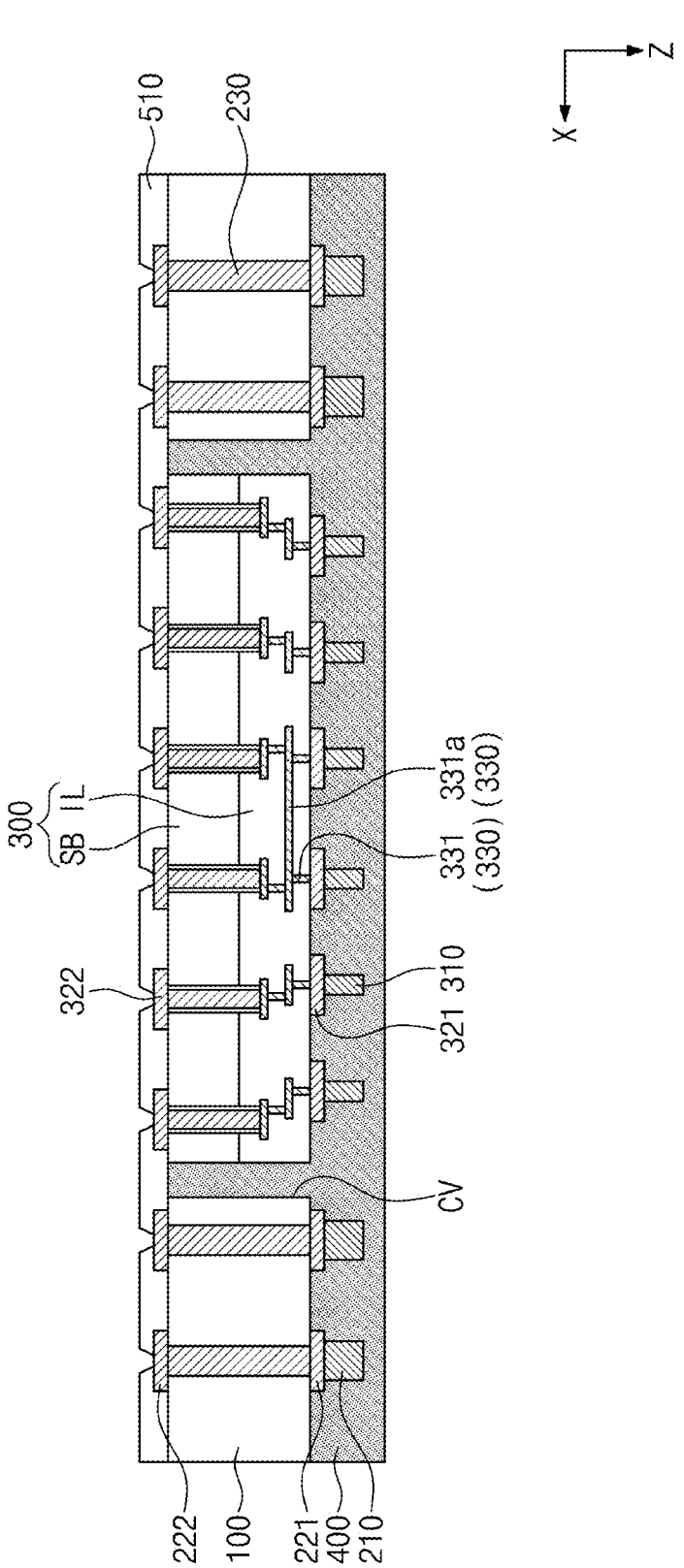

Referring to FIG. 6, the redistribution dielectric layer 510 may be formed on the bottom surface of the connection substrate 100 and the bottom surface of the third semiconductor chip 300. The redistribution dielectric layer 510 may cover the bottom surface of the connection substrate 100 and the bottom surface of the third semiconductor chip 300.

The redistribution dielectric layer 510 may be patterned to form a plurality of holes in the redistribution dielectric layer 510. The holes may expose the lower substrate pads 222 of the connection substrate 100 and the lower chip pads 322 of the third semiconductor chip 300. The patterning of the redistribution dielectric layer 510 may be performed by exposure and development processes.

Figure 7:
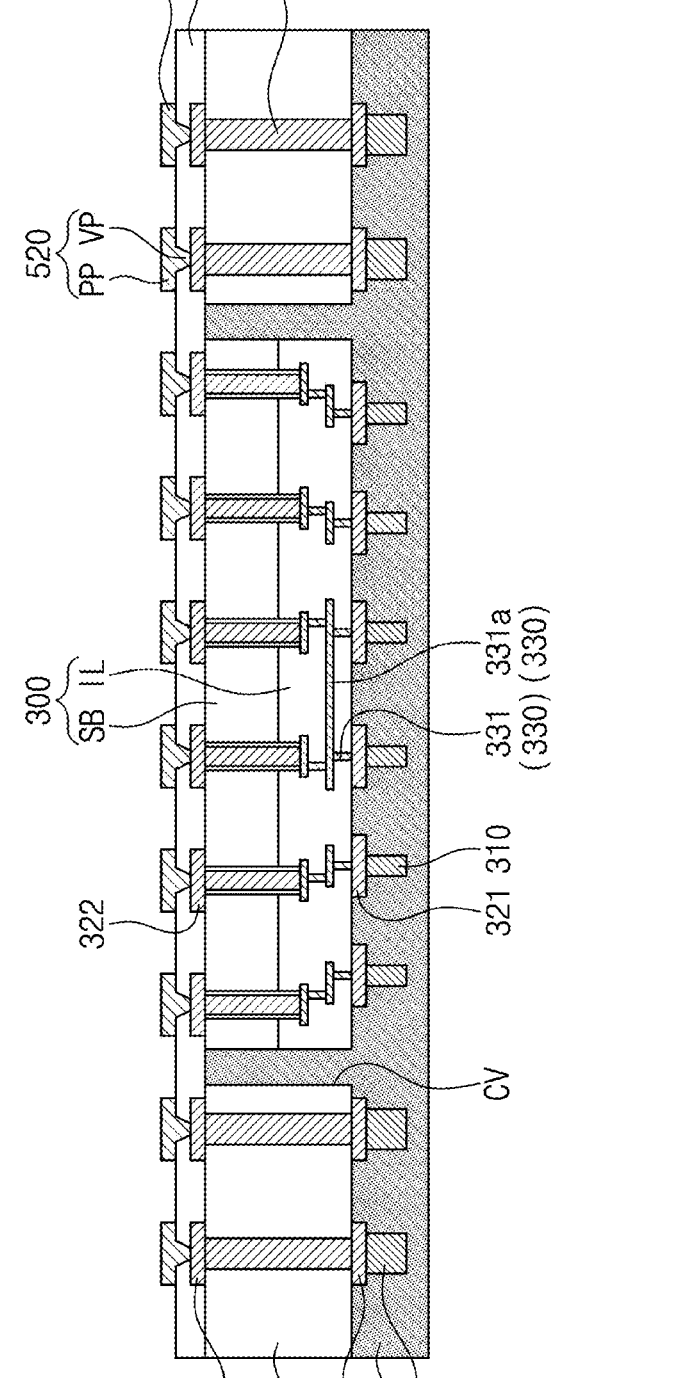

Referring to FIG. 7, the redistribution patterns 520 may be formed on the redistribution dielectric layer 510. For example, the formation of the redistribution patterns 520 may include forming a seed layer on the redistribution dielectric layer 510, forming a conductive layer by performing an electroplating process in which the seed layer is used as an electrode, and patterning the seed layer and the conductive layer. The conductive layer may include metal, e.g., copper (Cu). The redistribution pattern 520 may include a pad part PP provided in the hole and a via part VP provided in the redistribution dielectric layer 510.

Therefore, the redistribution substrate 500 may be formed on the bottom surface of the connection substrate 100 and the bottom surface of the third semiconductor chip 300.

Figure 8:
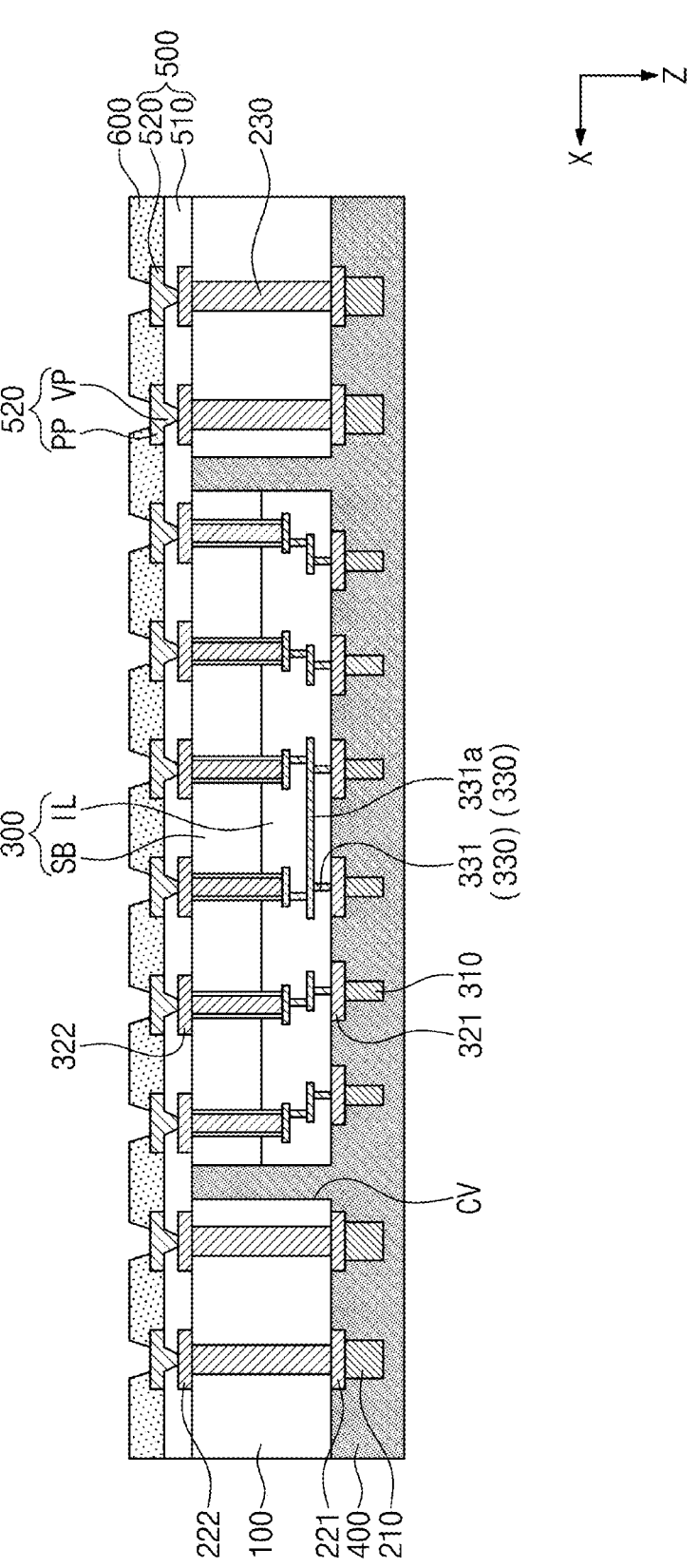

Referring to FIG. 8, the solder resist layer 600 may be formed to cover a bottom surface of the redistribution substrate 500. The solder resist layer 600 may be formed to expose at least a portion of the bottom surface of the redistribution substrate 500. For example, the solder resist layer 600 may be formed to expose the redistribution patterns 520 of the redistribution substrate 500. The solder resist layer 600 may be formed by coating a solder resist material to cover the bottom surface of the redistribution substrate 500, and then etching the coated solder resist material so as to expose at least a portion of the redistribution substrate 500.

Figure 9:
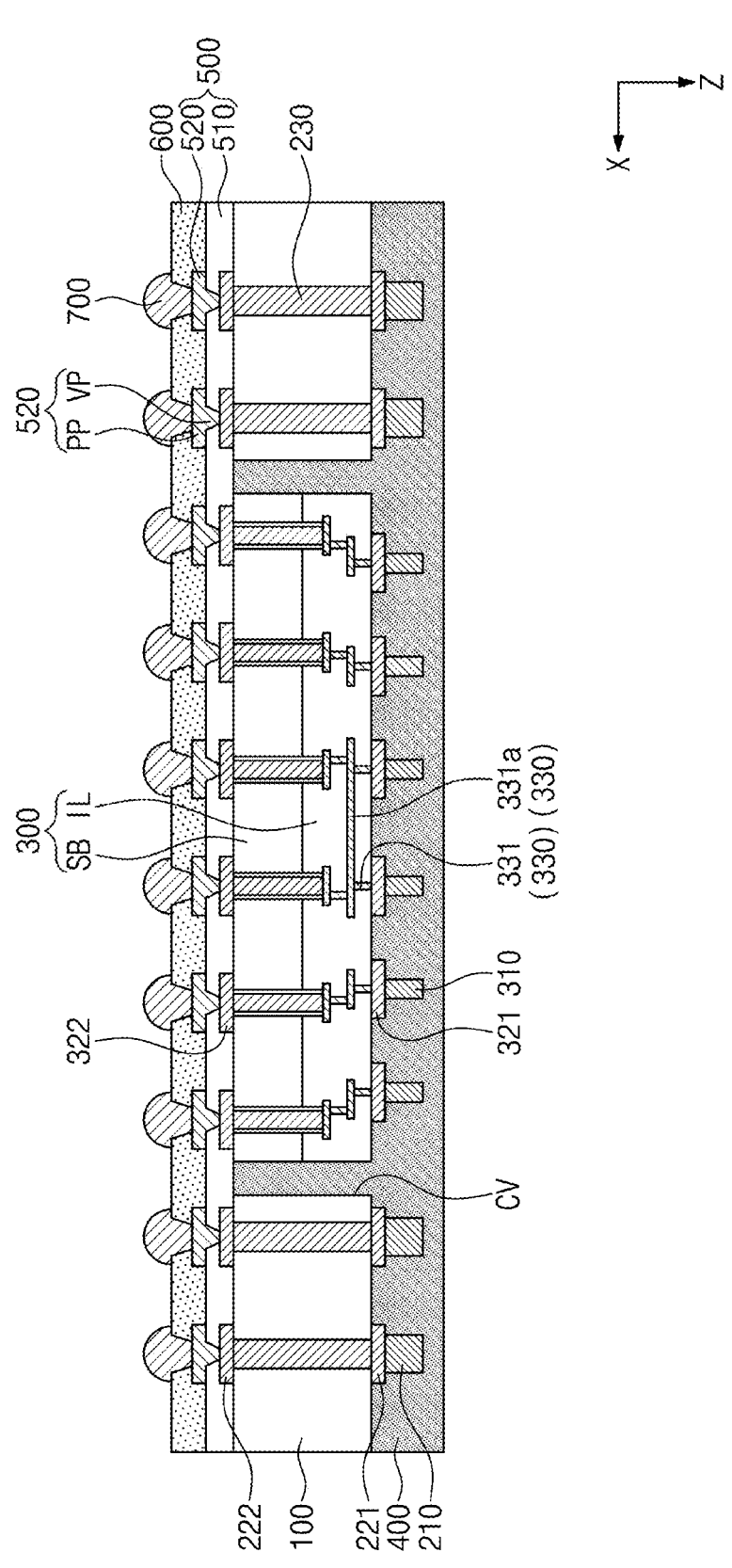

Referring to FIG. 9, the external connection terminals 700 may be formed on the bottom surface of the redistribution substrate 500 exposed by the solder resist layer 600.

Figure 10:
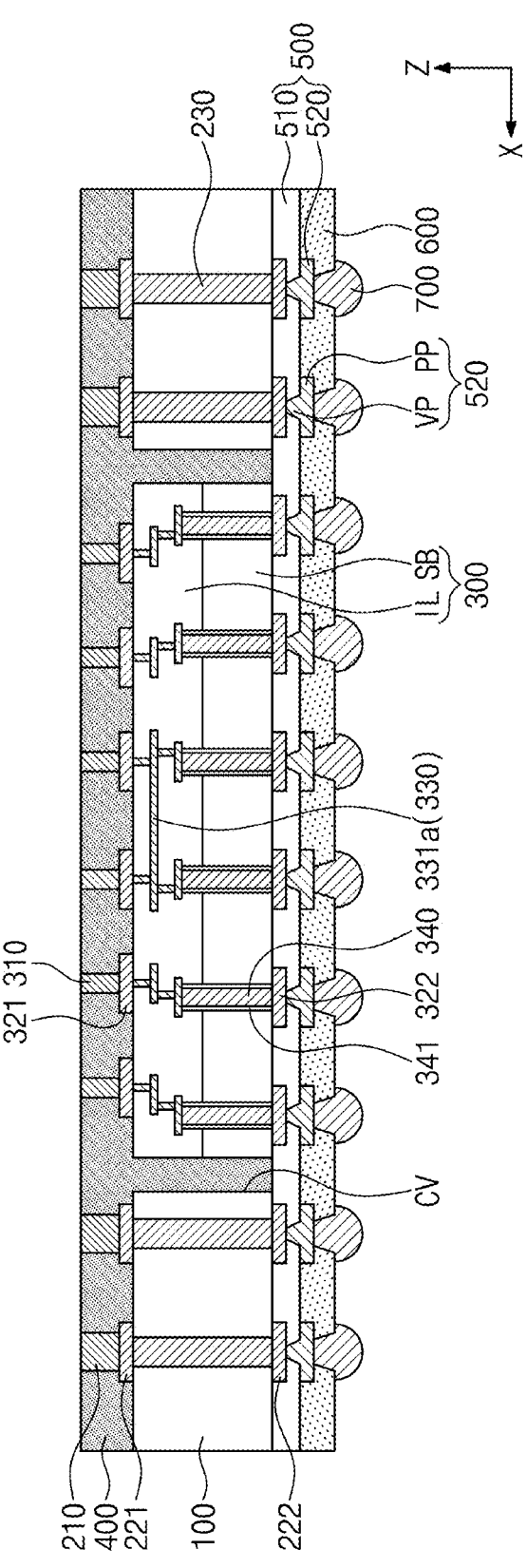

Referring to FIG. 10, the connection substrate 100 may be turned upside down again to allow the bottom surfaces of the third semiconductor chip 300 and the connection substrate 100 to face downwardly. The molding layer 400 may undergo a grinding process to planarize the molding layer 400. The grinding process may be performed on the molding layer 400 to expose top surfaces of the plurality of first bumps 310 and top surfaces of the plurality of second bumps 210.

Figure 11:
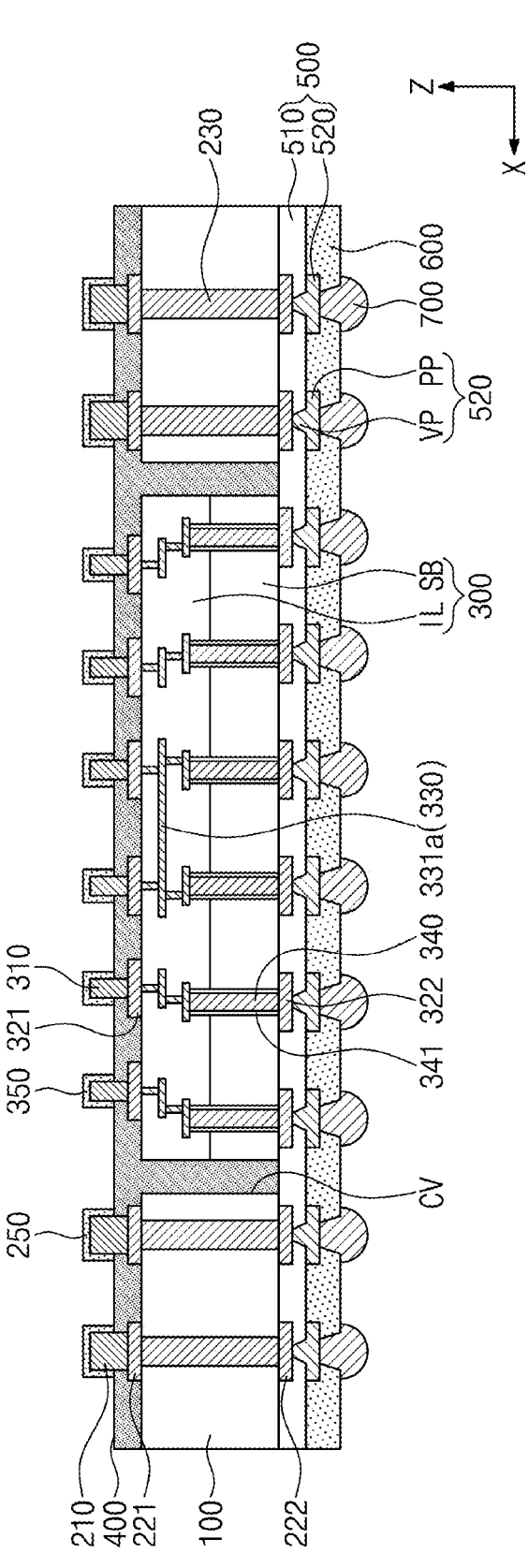

Referring to FIG. 11, an etching process may remove a portion of the molding layer 400 so as to allow the molding layer 400 to expose the plurality of first bumps 310 and the plurality of second bumps 210. Thereafter, an electroless nickel-gold plating process may be performed on surfaces of the exposed plurality of first bumps 310 and of the exposed plurality of second bumps 210.

An electroless nickel-gold plating layer may be formed by allowing a nickel plating solution to contact a surface of each of the plurality of first and second bumps 310 and 210, e.g., the nickel plating solution may contact an entire exposed surface of each of the plurality of first and second bumps 310 and 210, and then forming a gold plating layer by allowing a gold plating solution to contact the, e.g., entire, nickel plating layer, with the result that oxidation barrier layers 350 and 250 may be formed. As the surfaces of the plurality of first and second bumps 310 and 210 are covered with the oxidation barrier layers 350 and 250, it may be possible to prevent oxidation of the plurality of first bumps 310 and the plurality of second bumps 210.

Referring back to FIG. 2, the first semiconductor chip CH1 and the second semiconductor chip CH2 may be mounted on the plurality of first bumps 310 and the plurality of second bumps 210. For example, the first semiconductor chip CH1 may be mounted on the first bumps 310 of the third semiconductor chip 300 and on its adjacent second bumps 210 of the connection substrate 100, and the second semiconductor chip CH2 may be mounted on the first bumps 310 of the third semiconductor chip 300 and on its adjacent second bumps 210 of the connection substrate 100.

Each of the first and second semiconductor chips CH1 and CH2 may include the chip pads CP disposed on a bottom end thereof, and may also include the inner connection members CM that are correspondingly bonded to the chip pads CP. The first bumps 310 and the second bumps 210 may be connected to the inner connection members CM.

By way of summation and review, embodiments provide a semiconductor package having enhanced reliability. That is, according to embodiments, a third semiconductor chip serves as a bridge interposer, and thus, the third semiconductor chip may be directly connected through bumps to first and second semiconductor chips, with the result that an electrical connection between the first and second semiconductor chip is achieved more stably and promptly. In addition, as the first and second semiconductor chips are connected to each other through the third semiconductor chip, it is possible to omit the formation of a redistribution substrate for connection between the first and second semiconductor chips, thereby reducing manufacturing costs for semiconductor packages.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a connection substrate with a cavity;
a first semiconductor chip and a second semiconductor chip each mounted on the connection substrate;
a third semiconductor chip in the cavity of the connection substrate, the first semiconductor chip and the second semiconductor chip each having a portion vertically overlapping the third semiconductor chip and being connected to each other through the third semiconductor chip; and
a molding layer that covers an upper surface of the third semiconductor chip and an upper surface of the connection substrate, the molding layer being disposed below the first semiconductor chip and the second semiconductor chip,
wherein the third semiconductor chip includes first bumps that penetrate through and protrude from the molding layer, a first set of the first bumps being connected to the first semiconductor chip and a second set of the first bumps being connected to the second semiconductor chip.

2. The semiconductor package as claimed in claim 1, wherein the third semiconductor chip has a first thickness, the connection substrate has a second thickness, and the first thickness is equal to the second thickness.

3. The semiconductor package as claimed in claim 2, wherein the first thickness of the third semiconductor chip is in a range of about 100 μm to about 300 μm.

4. The semiconductor package as claimed in claim 1, wherein each of the first bumps has a pillar shape and a diameter of each of the first bumps is in a range of about 10 μm to about 40 μm.

5. The semiconductor package as claimed in claim 4, further comprising an oxidation barrier layer that covers a surface of each of the first bumps.

6. The semiconductor package as claimed in claim 1, wherein the third semiconductor chip includes a wiring layer connected to the first bumps, the wiring layer connecting the first semiconductor chip to the second semiconductor chip, and the wiring layer including a plurality of wiring lines.

7. The semiconductor package as claimed in claim 6, wherein the third semiconductor chip further includes a plurality of through vias below the wiring layer and connected to the wiring layer, one of the plurality of through vias is configured to transmit a first signal to the first semiconductor chip, and another of the plurality of through vias is configured to transmit a second signal to the second semiconductor chip.

8. The semiconductor package as claimed in claim 7, further comprising:
a redistribution substrate below the connection substrate and the third semiconductor chip, the redistribution substrate being connected to the plurality of through vias;
a solder resist layer that covers a bottom surface of the redistribution substrate and exposes a portion of the bottom surface of the redistribution substrate; and
a plurality of external connection terminals on the bottom surface of the redistribution substrate, each of the plurality of external connection terminals being located at a respective location of the bottom surface exposed by the solder resist layer.

9. The semiconductor package as claimed in claim 1, wherein:
a first portion of the connection substrate is connected to the first semiconductor chip,
a second portion of the connection substrate is connected to the second semiconductor chip, and
the connection substrate includes:
a conductive pillar that penetrates through the connection substrate, and
a second bump on a top surface of the conductive pillar, the second bump being penetrating through and extending from the molding layer, and the second bump being connected to one of the first semiconductor chip and the second semiconductor chip.

10. The semiconductor package as claimed in claim 9, wherein the first bumps and the second bump each have the same vertical length.

11. The semiconductor package as claimed in claim 10, wherein the vertical length of the first bumps and the second bump is in a range of about 10 μm to about 20 μm.

12. The semiconductor package as claimed in claim 9, wherein
the second bump has a pillar shape and a diameter of the second bump is in a range of 50 μm to 100 μm.

13. The semiconductor package as claimed in claim 9, further comprising an oxidation barrier layer that covers a surface of the second bump.

14. A semiconductor package, comprising:
a connection substrate with a cavity;
a first semiconductor chip and a second semiconductor chip mounted on the connection substrate;
a third semiconductor chip in the cavity of the connection substrate, the first semiconductor chip and the second semiconductor chip each having a chip portion vertically overlapping the third semiconductor chip and being connected to each other through the third semiconductor chip; and a molding layer that covers an upper surface of the third semiconductor chip and an upper surface of the connection substrate, the molding layer being disposed below the first semiconductor chip and the second semiconductor chip,
wherein the third semiconductor chip includes first bumps that penetrate through and protrude from the molding layer, a first set of the first bumps being connected to the first semiconductor chip and a second set of the first bumps being connected to the second semiconductor chip, and
wherein the connection substrate includes second bumps that penetrate through and protrude from the molding layer, a first set of the second bumps being connected to the first semiconductor chip and a second set of the second bumps being connected to the second semiconductor chip.

15. The semiconductor package as claimed in claim 14, wherein:
the third semiconductor chip and the connection substrate each have the same thickness, and
the first bumps and the second bumps each have the same vertical length.

16. The semiconductor package as claimed in claim 15, wherein:
the thickness of the third semiconductor chip and the connection substrate is in a range of about 100 μm to about 300 μm, and
the vertical length of the first bumps and the second bumps is in a range of about 10 μm to about 20 μm.

17. The semiconductor package as claimed in claim 14, wherein each of the first bumps and each of the second bumps has a pillar shape, a diameter of each of the first bumps being in a range of about 10 μm to about 40 μm, and a diameter of each of the second bumps being in a range of about 50 μm to about 100 μm.

18. The semiconductor package as claimed in claim 14, further comprising an oxidation barrier layer that covers a surface of each of the first bumps and each of the second bumps.

19. The semiconductor package as claimed in claim 14, further comprising a redistribution substrate below the third semiconductor chip, the third semiconductor chip further including:
a wiring layer in the third semiconductor chip, the wiring layer being connected to the first bumps and connecting the first semiconductor chip and the second semiconductor chip to each other; and
a through via in the third semiconductor chip below the wiring layer, the through via connecting the wiring layer and the redistribution substrate to each other.

20. A semiconductor package, comprising:
a connection substrate with a cavity;
a first semiconductor chip and a second semiconductor chip on the connection substrate and having a portion vertically overlapping the cavity;
a third semiconductor chip in the cavity of the connection substrate; and
a molding layer between the third semiconductor chip and the connection substrate, the molding layer surrounding the third semiconductor chip and a top surface of the connection substrate,
wherein the first semiconductor chip is mounted on the molding layer and is adjacent to a first side of the connection substrate, the first semiconductor chip being connected to the connection substrate and the third semiconductor chip, wherein the second semiconductor chip is mounted on the molding layer and is adjacent to a second side of the connection substrate, the second semiconductor chip being connected to the connection substrate and the third semiconductor chip, wherein the third semiconductor chip includes:

first bumps protruding from a top surface of the third semiconductor chip to penetrate through and extend from the molding layer, a first set of the first bumps connected to a bottom surface of the first semiconductor chip and a second set of the first bumps connected to a bottom surface of the second semiconductor chip, and a first oxidation barrier layer that covers a surface of each of the first bumps, wherein the connection substrate includes:

second bumps protruding from the top surface of the connection substrate to penetrate through and extend from the molding layer, a first set of the second bumps connected to the bottom surface of the first semiconductor chip and a second set of the second bumps connected to the bottom surface of the second semiconductor chip, and a second oxidation barrier layer that covers a surface of each of the second bumps, wherein the third semiconductor chip has the same thickness as the thickness of the connection substrate, wherein each of the first bumps and each of the second bumps has the same vertical length, wherein a diameter of each of the first bumps is in a range of about 10 μm to about 40 μm, and wherein a diameter of each of the second bumps is in a range of about 50 μm to about 100 μm.

* * * * *